(12) United States Patent
Román García et al.

(10) Patent No.: US 9,015,861 B2
(45) Date of Patent: Apr. 21, 2015

(54) MODIFICATION OF ATOMIC FORCE MICROSCOPY TIPS BY DEPOSITION OF NANOPARTICLES WITH AN AGGREGATE SOURCE

(75) Inventors: Elisa Leonor Román García, Madrid (ES); Lidia Martínez Orellana, Madrid (ES); Mercedes Díaz Lagos, Madrid (ES); Yves Huttel, Madrid (ES)

(73) Assignee: Consejo Superior de Investigaciones Cientificas (CSIC), Madrid (ES)

( * ) Notice: Subject to any disclaimer, the term of this patent is extended or adjusted under 35 U.S.C. 154(b) by 0 days.

(21) Appl. No.: 13/697,598

(22) PCT Filed: May 4, 2011

(86) PCT No.: PCT/ES2011/070319
§ 371 (c)(1),
(2), (4) Date: Jan. 11, 2013

(87) PCT Pub. No.: WO2011/141602
PCT Pub. Date: Nov. 17, 2011

(65) Prior Publication Data
US 2013/0111637 A1    May 2, 2013

(30) Foreign Application Priority Data
May 13, 2010   (ES) .................. 201030712

(51) Int. Cl.
*G01Q 70/12*    (2010.01)
*G01Q 60/38*    (2010.01)
*G01Q 60/42*    (2010.01)
*B82Y 15/00*    (2011.01)
*B82Y 35/00*    (2011.01)

(52) U.S. Cl.
CPC ............ *G01Q 60/38* (2013.01); *B82Y 15/00* (2013.01); *B82Y 35/00* (2013.01); *G01Q 60/42* (2013.01)

(58) Field of Classification Search
USPC ........... 850/33, 40, 41, 42, 52, 55, 56, 58, 59, 850/60, 61
See application file for complete search history.

(56) References Cited

U.S. PATENT DOCUMENTS

2007/0178229 A1*  8/2007  Bergendahl et al. .......... 427/127
2009/0133171 A1*  5/2009  Jin .................................. 850/60

OTHER PUBLICATIONS

Cespedes et al., "Fabrication of Magnetic Force Microscopy Tips via Electrodeposition and Focused Ion Beam Milling", IEEE Transactions on Magnetics 44(11):3248-3251 (2008).
Das et al., "Measurements on hydrophobic and hydrophilic surfaces using a porous gamma alumina nanoparticle aggregate mounted on Atomic Force Microscopy cantilevers", Thin Solid Films 518:2769-2774 (2010).
Han et al., "Fabrication and Characterization of carbon nanotube tip modified by focused ion beam", Proc of the 2nd IEEE International Conference on Nano/Micro Engineered and Molecular Systems 290-293 (2007).

(Continued)

*Primary Examiner* — Nicole Ippolito
(74) *Attorney, Agent, or Firm* — Porzio, Bromberg & Newman, P.C.

(57) ABSTRACT

The present invention relates to a method for covering Atomic Force Microscopy (AFM) tips by depositing a material in the form of nanoparticles with an aggregate source.

8 Claims, 4 Drawing Sheets

(56) References Cited

OTHER PUBLICATIONS

Ong et al., "Attachment of nanoparticles of the AFM tips for direct measurements of interaction between a single nanoparticles and surfaces", Journal of Colloid and Interface Science 310:385-390 (2007).
L. Martinez,1 M. Tello,2 M. Diaz,1 E. Roman,1 R. Garcia,2 and Y. Huttel1; Aspect-ratio and lateral-resolution enhancement in force microscopy by attaching nanoclusters generated by an ion cluster source at the end of a silicon tip. 1 Instituto de Ciencia de Materiales de Madrid, Consejo Superior de Investigaciones Cientificas (CSIC) C/ Sor Juana Inés de la Cruz, 3 28049 Madrid, Spain.
Silvia Hormeño, Marcos Penedo, Cristina V Manzano and Mónica Luna; Gold nanoparticle coated silicon tips for Kelvin probe force microscopy in air; IMM-Instituto de Microelectrónica de Madrid (CNM-CSIC), Isaac Newton 8, PTM, E-28760 Tres Cantos, Madrid, Spain; Nanotechnology 24 (2013) 395701 (9pp).
Takagi, "Ionized Cluster Beam (ICB) Deposition and Processes." Pure & Appl. Chem., vol. 60, No. 5, p. 781-794, 1998.
Diaz, et al., "Morphological, Structural, and Magnetic Properties of Co Nanoparticles in a Silicon Oxide Matrix." J Nanopart Res (2011) 13:5321-5333.

* cited by examiner

MODIFICATION OF ATOMIC FORCE MICROSCOPY TIPS BY DEPOSITION OF NANOPARTICLES WITH AN AGGREGATE SOURCE

CROSS REFERENCE TO RELATED APPLICATION

This is a National Stage of International Application No. PCT/ES2011/070319, filed 4 May 2011, which claims the benefit of Application No. P201030712, filed in Spain on 13 May 2010, the disclosures of which Applications are incorporated by reference herein.

The present invention relates to a method for coating AFM (Atomic Force Microscopy) tips by means of depositing a material in the form of nanoparticles with an ion cluster source.

PRIOR STATE OF THE ART

The resolution limit of a current atomic force microscope (AFM) is conditioned by the geometry of the tips used for measurement process. Generally, the topography of nano-objects, such as for example cobalt nanoparticles deposited on a flat silicon surface: a profile made up of said spherical nanoparticles reveals a width which is much greater than the height, can be seen. This is a well known fact among scanning probe microscopy (SPM) users and it is due to the convolution of the tip shape with the morphology of the objects, in this case, of the particles whose characteristics are being measured. Tips with a higher aspect ratio (difference between tip length and radius) allow moving the tip closer for scanning holes and crevices, which improves the resolution of SPM measurements. Generally, AFM tips are usually square-based pyramids with a mean radius of 7 nm. Tips with a high aspect ratio having lower radii of curvature are also marketed, although their individualized production process using the ion milling technique leads to a very high cost, in addition to their inherent fragility which leads to lower mean life span than more conventional tips.

Tip modification is rather widespread among advanced SPM users such that commercial tips are modified for use in magnetic force microscopy (MFM) measurements, piezo response measurements, etc. This functionalization does not attempt to modify the aspect ratio of the tip but to achieve specific properties (magnetic properties, piezoelectric properties, etc.) by means of modifying its chemical composition [G. Macedo, D. Ananias, P. S. André, R. A. Sa Ferreira, A. L. Kholkin, L. D. Carlos and J. Rocha, *Nanotechnology*, 19 5 (2008) 295702]. Furthermore, the production processes used sometimes involve an aspect ratio reduction, as described in the article by A. Geissler et al. [A. Geissler, M.-F. Vallat, L. Vidal, J.-C. Voegel, J. Hemmerle, P. Schaaf, and V. Roucoules, *Langmuir* 24 (2008) 4874-4880], and in the article by Quy K. Ong et al. [Quy K. Ong, Igor Sokolov, *Journal of Colloid and Interface Science*, 310 (2007) 385-390].

On the other hand, advances in aspect ratio improvement are aimed at functionalizing tips with carbon nanotubes, as described in the article by S. S. Wong et al. [S. S. Wong, A. T. Woolley, E. Joselevich, C. M. Lieber, *Chemical Physics Letters*, 306 (1999) 219-225] (an expensive recently marketed tip). It must be highlighted that such modification does not allow modifying tip chemistry in a simple manner for specific applications.

DESCRIPTION OF THE INVENTION

The present invention provides a method for coating atomic force microscopy (AFM) tips by means of depositing nanoparticles with an ion cluster source (ICS).

A first aspect of the present invention relates to a method for coating at least one AFM tip by means of ion cluster source technique with the material for coating in the form of nanoparticles.

In a preferred embodiment, the material used for coating the AFM tip is selected from the list comprising: metallic material, magnetic material, piezoelectric material, conductive material, insulating material, dielectric material and any combinations thereof. In a more preferred embodiment, the material is selected from metallic material, magnetic material or semiconductor material. This material is located in a first chamber called an ion cluster source.

In a preferred embodiment, the ion cluster source technique is performed in vacuum or ultra high vacuum conditions in the first chamber, and in an attached chamber connected to the ion cluster source where the AFM tip to be coated is located.

The method of the invention proposes a modification of the aspect ratio of the AFM tip by means of depositing nanoparticles with a controlled size. This further entails the possibility of depositing nanoparticles of a desired specific material (metallic material, magnetic material, piezoelectric material, conductive material, insulating material, . . . ), such that once an aspect ratio improvement is obtained, a modification of the tip's chemical composition would be obtained; in other words, AFM tips which allow obtaining better resolutions and which are functionalized are achieved.

The method of the invention is carried out by means of the ion cluster source technique consisting of deposition by means of an ion cluster source in vacuum or ultra high vacuum (UHV) conditions. The operation of this equipment consists of generating a plasma of ions of the desired material in a gas-controlled atmosphere. Said gas is preferably selected from argon, helium, nitrogen, oxygen or any combinations thereof, and more preferably argon or helium, given that they favor the clustering of the ions of the material for generating nanoparticles.

A precise size and density control of the nanoparticle coating is obtained with such ICS.

The use of an ICS assures the chemical purity of the clusters since it is a vacuum or UHV process. It further allows producing clusters with controlled sizes from any type of material on any type of surfaces (any marketed tip or tip known by any person skilled in the art). Unlike other production methods it is a technique which prevents damaging the original tip as a result of the moderate kinetic energy adsorption, soft landing, of the nanoparticles during the deposition process.

Precise control of the nanoparticle production process is obtained with this technique by means of adjusting the different variables determining it (gas flow, magnetron power, clustering distance, time . . . ), along with precise control of the nanoparticle size distribution and the coating density of the surface to be coated (AFM tip). The nanoparticles produced by means of this method are homogenously and randomly distributed on the small surface of the AFM tip.

The operating conditions are generally: the coating time, the clustering distance, the magnetron power and the gas flows, all these being interdependent parameters and variables according to the type of material to be used.

In a second aspect, the present invention relates to a coated AFM tip which can be obtained by the method of the invention.

It is important to point out that the method of modifying AFM tips of the present invention is easy to implement on an industrial scale since sputtering processes in vacuum chambers are already commonly used in the industry. Continuous modification of AFM tips would be allowed by coupling an ICS to these already existing chambers.

A third aspect of the present invention relates to the use of the AFM tip as described above for surface morphological characterization, determination of magnetic or piezoelectric properties of objects and nanoparticle deposition. On the other hand, the functionalization of AFM tips by means of depositing nanoparticles with a controlled chemical composition allows characterizing the nano-objects from their physicochemical property view point. For example, AFM tips can be coated with nanoparticles of piezoelectric or magnetic materials to investigate the piezoelectric or magnetic properties of the nano-objects.

Throughout the description and claims, the word "comprises" and its variants do not intend to exclude other technical features, supplements, components or steps. For persons skilled in the art, other objects, advantages and features of the invention will be inferred in part from the description and in part from the practice of the invention. The following examples and drawings are provided by way of illustration and are not meant to limit the present invention.

EXAMPLES

The invention will be illustrated below by means of several tests performed by the inventors clearly showing the specificity and effectiveness of the method of the invention for coating or modifying the surface of AFM tips.

The tests performed focused on comparing the AFM images obtained with non-modified commercial AFM tips and with commercial tips modified by means of depositing nanoparticles generated by an ion cluster source.

The depositions have been performed in ultra high vacuum conditions using an ion cluster source produced by Oxford Applied Research and a $Co_{95}Au_5$ alloy blank.

Figure 1:
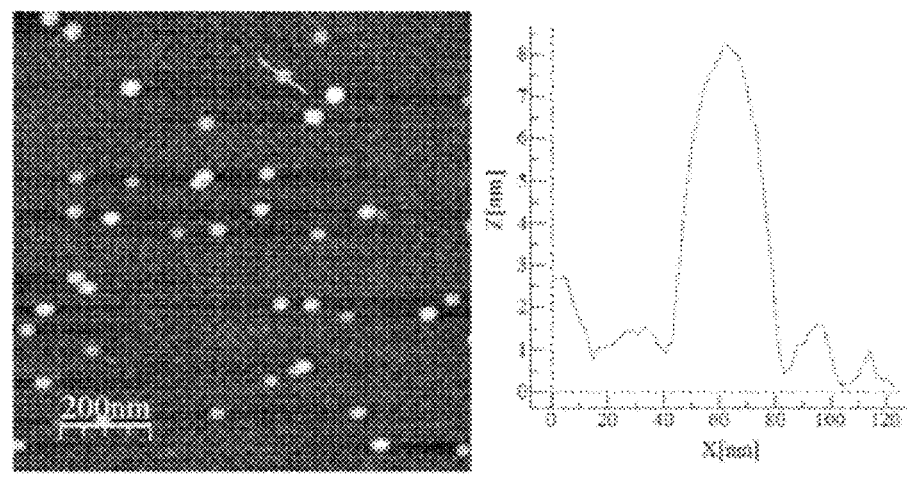
FIG. 1—the image on the left shows the topography acquired by means of the AFM of cobalt nanoparticles (right) a nanoparticle profile. It is seen in the profile made of said spherical nanoparticles that the width is much greater than the height.
Figure 2:
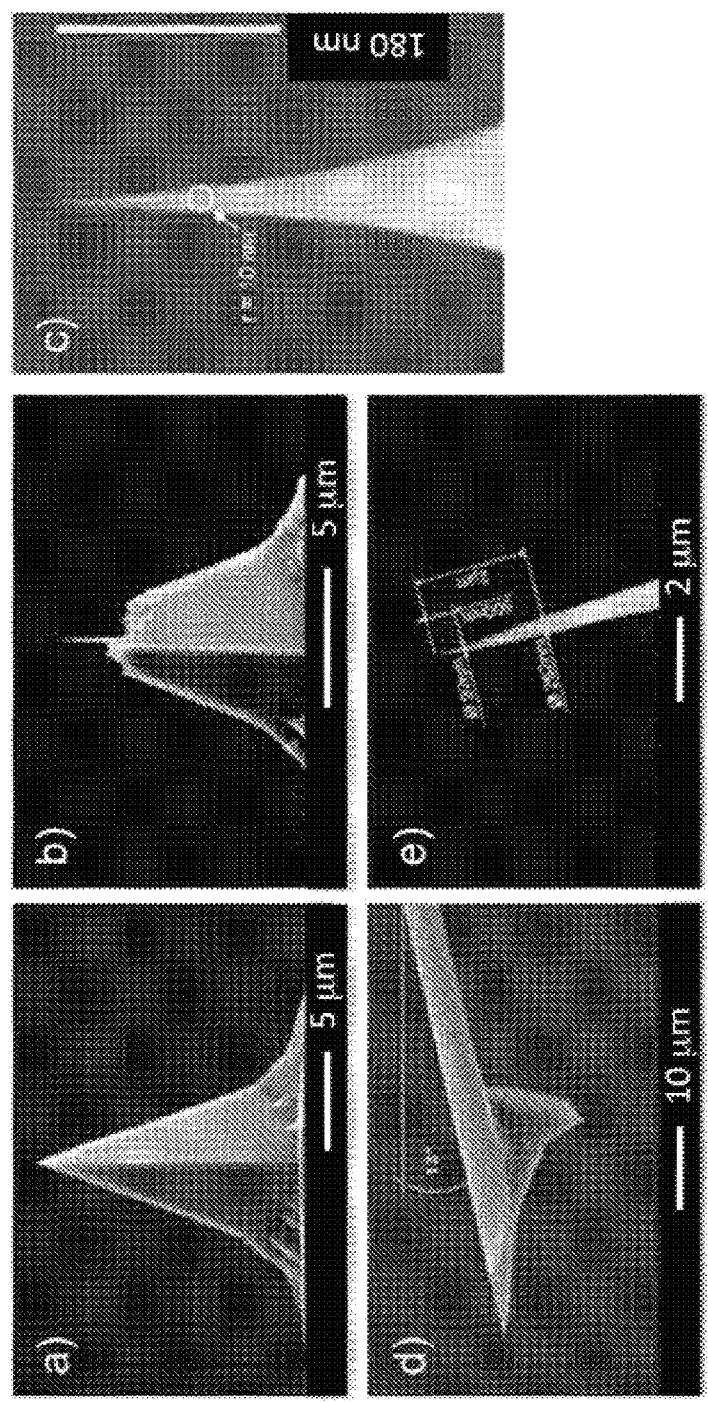
FIG. 2 shows examples of SEM (Scanning Electron Microscopy) images of commercial tips (nanosensors) obtained by ion milling.
Figure 3:
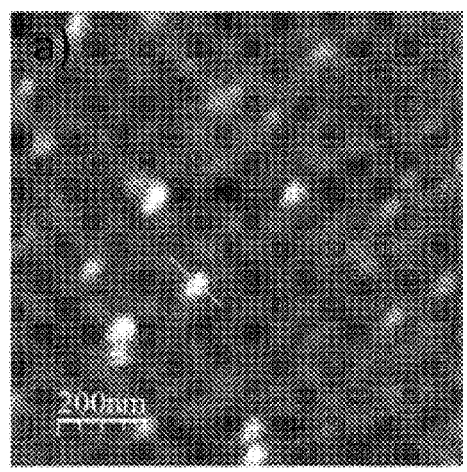
FIG. 3 shows a) AFM image of nanoparticles of 2-3 nm on a Si substrate (100); b) a nanoparticle profile; c) diagram of AFM tip with nanoparticles.
Figure 3:
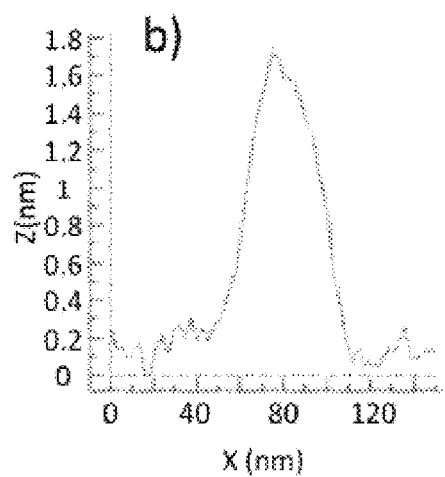
Figure 3:
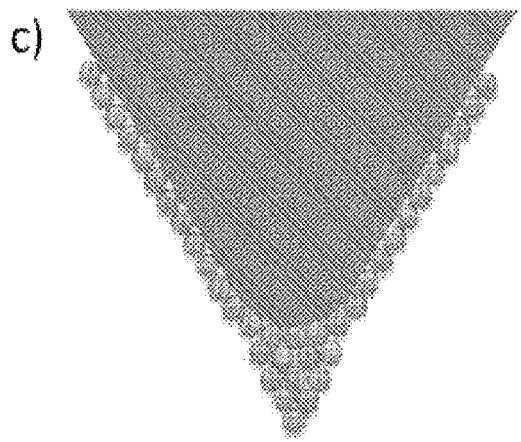

The nanoparticle production process has been optimized, such that spherical nanoparticles of 2-3 nm were produced with the aid of the ICS. To that end the relevant parameters were: power applied to the magnetron: 20 W; clustering length: 50 mm; argon flow: 60 sccm; helium flow: 50 sccm; distance between ion cluster source and AFM tips: 190 mm; deposition time: 2 minutes. FIGS. 3a-b depict an example of the deposition of these nanoparticles of approximately 2-3 nm in diameter; in FIGS. 3a-b the nanoparticles are deposited on a flat silicon substrate. The deposition of these nanoparticles on commercial AFM tips results in obtaining tips with a better aspect ratio and also controlled chemical composition (FIG. 3c).

Figure 4:
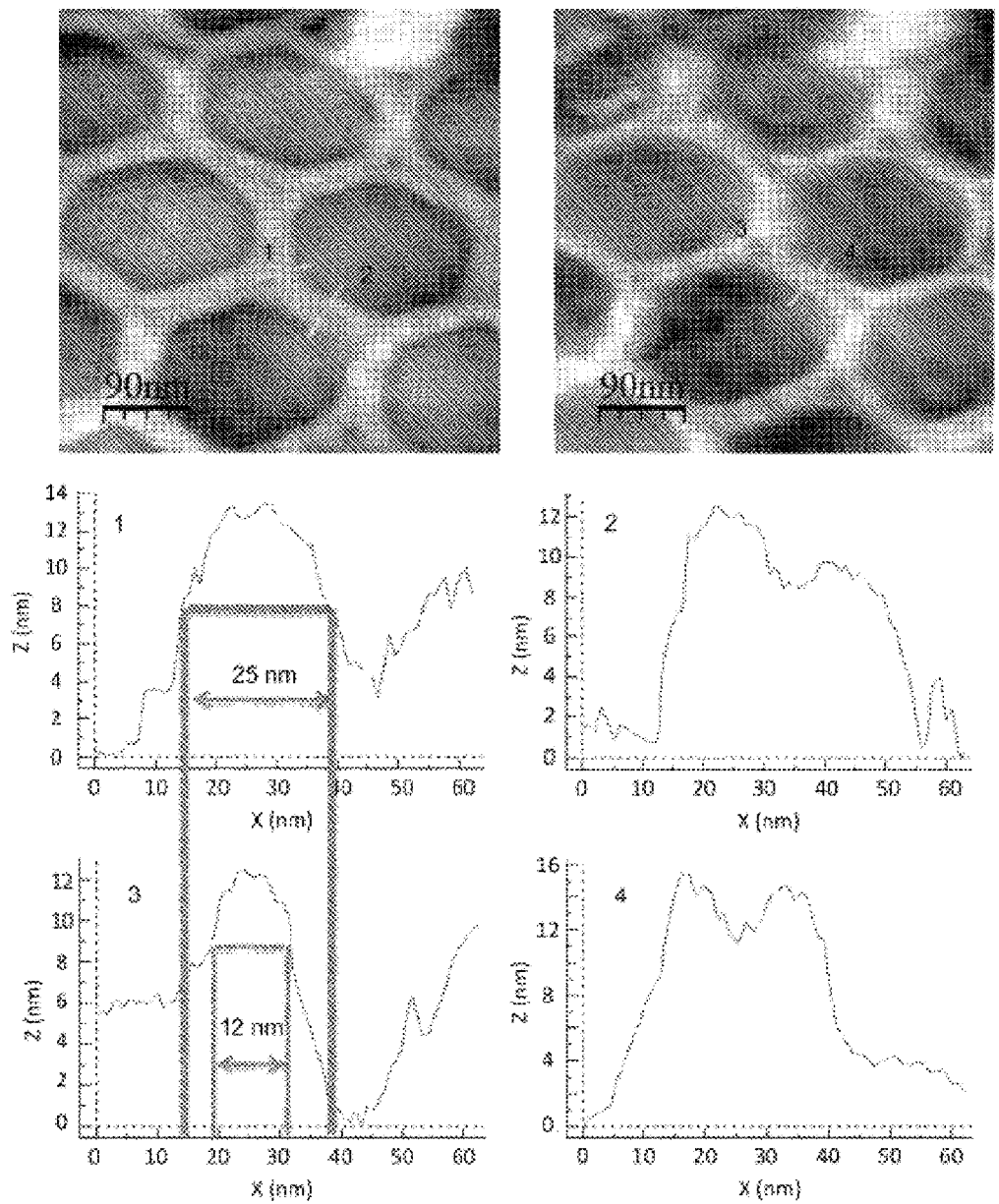
FIG. 4—left: AFM image obtained with a non-modified commercial tip; right: image of the same sample obtained with the commercial tip modified by means of nanoparticle deposition; bottom: profiles in specific areas of the top images.

A standard sample has been measured with non-modified commercial AFM tips and modified commercial AFM tips with a deposition of nanoparticles 2-3 nm in diameter. FIG. 4 depicts a comparison of the measurements taken with both tips in the exact same area of the standard sample. The images correspond to a 450×450 $nm^2$ area. A series of structures which did not appear in the image recorded with the commercial tip can be clearly seen in the image recorded with the modified AFM tip. This is because the modified tip with nanoparticles has a better resolution than commercial tips since it has a lower degree of uncertainty, which allows resolving structures with greater resolution. The profiles depicted at the bottom of FIG. 4 more precisely illustrate the improved resolution of the modified tip. A systematic reduction in the measured structure (peak width) due to better resolution can be seen in these profiles.

FIG. 4 shows the morphological effect of depositing nanoparticles on a commercial tip. This morphological effect must be combined with the chemical effect in each case, such as for example, the deposition of magnetic material which will allow using these tips for MFM (magnetic force microscopy) measurements.

The invention claimed is:

1. A method for coating at least one AFM tip comprising the step of coating the at least one AFM tip by means of ion cluster source technique with a material for coating in the form of spherical nanoparticles in three dimensions with a controlled size.

2. The method according to claim 1, wherein the material is selected from the list comprising: metallic material, magnetic material, piezoelectric material, conductive material, insulating material, dielectric material, semiconductor material and any combinations thereof.

3. The method according to claim 2, wherein the material is selected from metallic material, magnetic material or semiconductor material.

4. The method according to claim 1, wherein a gas which is selected from helium, argon, oxygen, nitrogen or any combinations thereof is used in the clustering area of the ion cluster source technique.

5. The method according to claim 4, wherein the gas is selected from argon or helium.

6. The method according to claim 1, wherein the technique is performed in vacuum or ultra vacuum conditions in the chamber attached to the clustering area of the ion cluster source technique.

7. A coated AFM tip which can be obtained by the method according to claim 1.

8. Use of the AFM tip according to claim 7 for surface morphological characterization, determination of the magnetic or piezoelectric properties of objects and nanoparticle deposition.

* * * * *